United States Patent [19]

Gebhardt et al.

[11] Patent Number: 4,751,420

[45] Date of Patent: Jun. 14, 1988

[54] ULTRASONIC TEST HEAD

[75] Inventors: Wolfgang Gebhardt, Spiesen-Elversberg; Helmut Woll, Dudweiler, both of Fed. Rep. of Germany

[73] Assignee: Fraunhofer-Gesellschaft zur Forderung der Angewandten Forschung e.V., Munich, Fed. Rep. of Germany

[21] Appl. No.: 927,523

[22] Filed: Nov. 5, 1986

[30] Foreign Application Priority Data

Nov. 15, 1985 [DE] Fed. Rep. of Germany ....... 3540610

[51] Int. Cl.⁴ ........................................ H01L 41/08

[52] U.S. Cl. .............................. 310/327; 310/336; 73/649

[58] Field of Search ................ 310/326, 327, 334–336; 73/642, 644, 649

[56] References Cited

U.S. PATENT DOCUMENTS 3,794,866 2/1974 McElroy ............................ 310/327
4,507,582 3/1985 Glenn ................................ 310/327

FOREIGN PATENT DOCUMENTS 0128049 7/1984 European Pat. Off. .
2926182 1/1981 Fed. Rep. of Germany .
50234 11/1965 Poland ................................ 310/327
1086640 11/1967 United Kingdom ................ 310/327

OTHER PUBLICATIONS

Patent Abstracts of Japan, P-169 dated Jan. 21, 1983.
Article entitled "Hybrid Linear and Matrix Acoustic Arrays", from Ultrasonics, May 29, 1980.

*Primary Examiner*—Mark O. Budd
*Attorney, Agent, or Firm*—Jeffers, Hoffman & Niewyk

[57] ABSTRACT

An ultrasonic test head including an oscillating crystal (1). A damping body (2) is mounted on the side of the crystal which faces away from the sonic beam direction. The damping body includes a plurality of sound-conducting and sound-absorbing lamellae (3, 5) which are stacked alternately on one another and each have one side thereof coupled to the oscillating crystal (1) thereby providing a high acoustic impedance as well as a high absorption.

18 Claims, 4 Drawing Sheets

ULTRASONIC TEST HEAD

BACKGROUND OF THE INVENTION

This invention relates to ultrasonic test heads and more particularly relates to ultrasonic test heads wherein a damping body is arranged on an oscillating crystal on the opposite side from the direction of the sonic beam.

One example of such an ultrasonic test head is shown in German patent publication No. 22 17 472. This prior art ultrasonic test head includes an oscillator composed of lithium sulfate or a similar crystalline material and a damping body made from a curable synthetic resin to which a heavy metal powder is added to thereby increase the specific impedance of the casting resin. The powdery heavy metal additive comprises tungsten.

However, in order to provide a very wideband test head, it is often necessary to increase the metal powder content far beyond 50 percent by volume, which poses extremely great manufacturing difficulties. Additionally, problems are also encountered regarding the reproducibility of the device. It is therefore an object of the instant invention to provide an ultrasonic test head with a damping body which is characterized by a high acoustic impedance, having high acoustic absorption and which is easy to manufacture.

SUMMARY OF THE INVENTION

The present invention overcomes the disadvantages of the above described prior art ultrasonic test heads by providing an improved ultrasonic test head therefor.

The ultrasonic test head includes a damping body which is comprised of a plurality of sound conducting and sound absorbing lamellae, the lamellae are arranged in an alternating stacked arrangement wherein one side of each lamellae is in contact with and coupled to the oscillating crystal.

In a preferred embodiment of the invention, the sound-conducting lamellae consists of lead platelets each of which has a wedge-shaped cross section, with the thickness of the wedge base being approximately 1.5 mm. Arranged between wedge-shaped lead platelets are teflon wedges whose bases also have a thickness of 1.5 mm. All of the layers are secured to one another with an adhesive and additionally may be clamped together so as to increase the mechanical integrity of the test head. Since the sound-conducting wedges are composed of lead, it is possible to solder the wedges to the electrodes of the oscillating crystal, as opposed to cementing or gluing, to further improve the acoustic properties.

The damping body may be arranged for any conceivable and desirable geometry of the oscillating crystal and in particular may be adapted for array ultrasonic test heads.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawings, wherein.

Corresponding reference characters indicate corresponding parts throughout the several views of the drawings.

The exemplifications set out herein illustrate preferred embodiments of the invention, in one form thereof, and such exemplifications are not to be construed as limiting the scope of the disclosure or the scope of the invention in any manner.

DESCRIPTION OF THE PREFERRED EMBODIMENT

Figure 1:
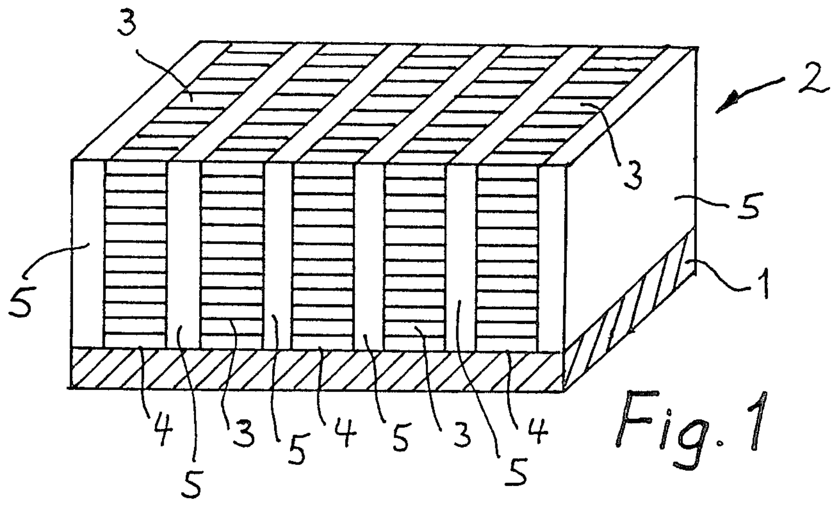
FIG. 1 is a perspective view of an ultrasonic test head which incorporates a preferred embodiment of the invention.

FIG. 1 shows a simplified, perspective view of an ultrasonic test head without its housing. The test head includes a piezo plate 1 as an oscillating crystal which may be excited to oscillate with the aid of high-frequency electrical signals. The electrical lines for supplying the excitation voltage and the electrode surfaces which are conventionally provided on both sides of the piezo plate 1, are omitted in FIG. 1.

Fastened to the side of the piezo plate 1 which, in the embodiment of FIG. 1, is secured to the upper surface by gluing, cementing or soldering, is a damping body 2 which possesses a high specific acoustic impedance, the objective being to keep the difference of the acoustic impedances of the piezo plate 1 and the damping body 2 as small as possible so as to achieve a wide bandwidth for the ultrasonic test head. Additionally, the damping body 2 is highly absorbent whereby a wave which emanates from the piezo plate 1 and propagates into the damping body 2 will not generated any interfering echos.

In the embodiment illustrated in FIG. 1, the damping body 2 consists of several sound-conducting lamellae 3 which are glued, cemented or soldered along their narrow sides 4 to the upper surface of the piezo plate 1.

Sound-absorbing lamellae 5 which function as damping layers are provided between the sound-conducting lamellae 3. Sound conducting lamellae 3 may be composed of lead, steel, brass, zinc or other metal. The sound-absorbing layers 5 may consist of teflon, silicone rubber, rubber, PVC, casting resin or plastic adhesive.

Typical dimensions for the damping body 2 are a thickness of 1 cm to 4 cm, a length of 1 cm to 6 cm, and a width of 1 cm to 4 cm. The thickness of each sound-conducting lamellae 3 is in the range of is 0.5 mm to 5 mm and preferably about 1.5 mm. The thickness of the sound-absorbing lamellae 5 is in the same range as that of the sound-conducting lamellae 3.

Figure 11:
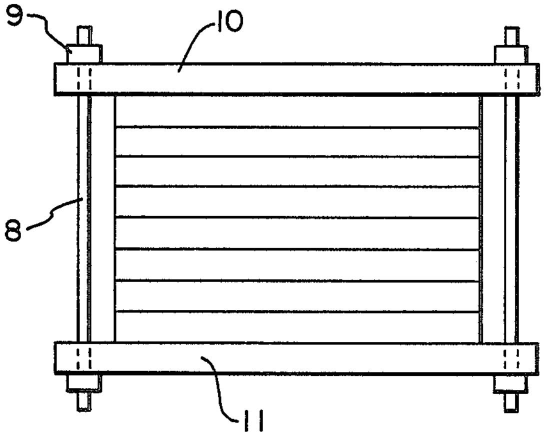
FIG. 11 is a front elevational view of a clamping arrangement for damping the lamellae of a test head.
Figure 12:
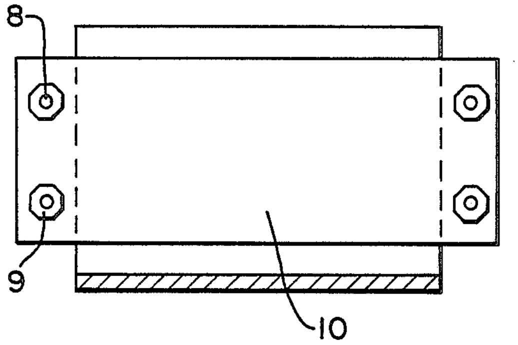
FIG. 12 is a plan view of the arrangement of FIG. 11.
Figure 13:
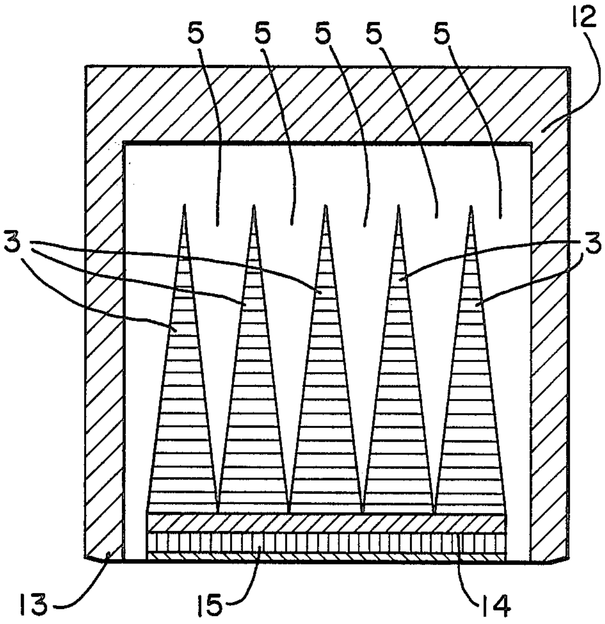
FIG. 13 is a cross-sectional view of a test head which is cast in a metal housing.

To increase the mechanical integrity of the test head, the sound-conducting lamellae 3 and the sound-absorbing lamellae 5 may be held together with the aid of a clamp type mounting device one arrangement for a test head including a clamp mounting device is shown in FIGS. 11 and 12. The clamp type mounting device may consist, for example, of two plates 11 and 12 which form the bottom and top plates for the stack of lamellae 3, 5 and which plates are secured together with the aid of threaded rods 8 and nuts 9. The entire arrangement may be cast into a metallic housing 12 whose bottom edge 13 protrudes beyond the bottom side 14 of piezo plate 1 as shown in FIG. 13. The space so created may accommodate a protective layer 15, such as a glass plate which prevents damage to the piezo plate 1 when the ultrasonic test head is being moved or shifted on a rough surface.

Figure 2:
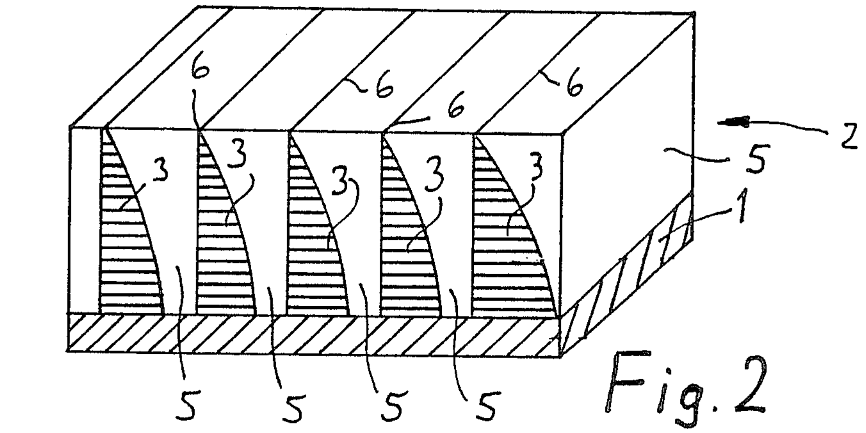
FIG. 2 is a perspective view of an ultrasonic test head according to the present invention wherein the sound conducting lamellae taper toward their upper edges.
Figure 4:
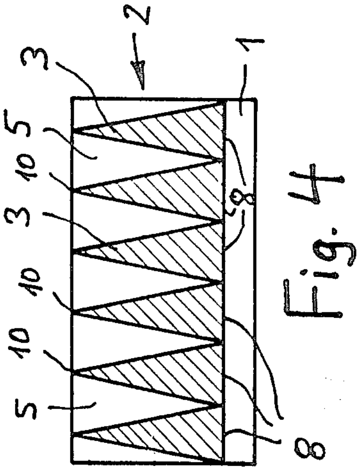
FIG. 4 is a cross sectional view of an ultrasonic test head according to the present invention with a wedge-shaped lamellae arrangement.
Figure 7:
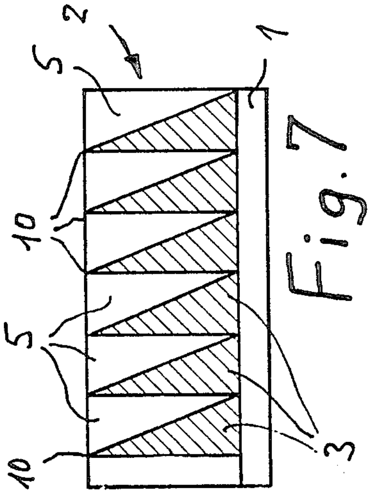
FIG. 7 is a cross sectional view of an ultrasonic test head according to the present invention with a saw-tooth-shaped lamellae arrangement.

The bandwidth of the ultrasonic test head is determined by the specific acoustic impedance of the lamellae 3, 5 which are arranged substantially perpendicularly to the piezo plate 1. The impedance depends, among other factors, on the material of the lamellae and on the thickness of the lamellae. The oscillation of the piezo plate 1 generates plate waves in the sound-conducting lamellae 3 which waves are damped by the sound-absorbing lamellae 5. This sound conducting effect is further increased by beveling the sound-conducting lamellae 3. FIGS. 2, 4 and 7 show especially advantageous profiles for the sound-conducting lamellae 3. By proper selection of the thickness of the lamellae it is possible to vary the sound velocity and thus the specific acoustic impedance of damping body 2 by nearly a factor of two. Using various materials for the lamellae, it is thus possible to realize practically any specific acoustic impedance which may be required and to thereby achieve an increase of the bandwidth.

FIG. 2 shows a damping body 2 whose sound-conducting lamellae 3, unlike the sound-conducting lamellae 3 of the embodiment of FIG. 1, do not have a constant thickness, but whose thickness decreases toward their upper edges 6. By tapering the sound-conducting lamellae 3 in the desired sonic beam direction of the ultrasonic test head what is accomplished is that no reflections will occur at the upper edges 6 as is possible with the arrangement shown in FIG. 1. The damping layers which are disposed between the sound-conducting lamellae 3, namely the sound-absorbing lamellae 5, have a complementry shape and may be formed in the intermediate spaces by casting. The sound-absorbing lamellae 5 which are located between the sound-conducting lamellae 3 may also have tungsten powder embedded therein.

Figure 3:
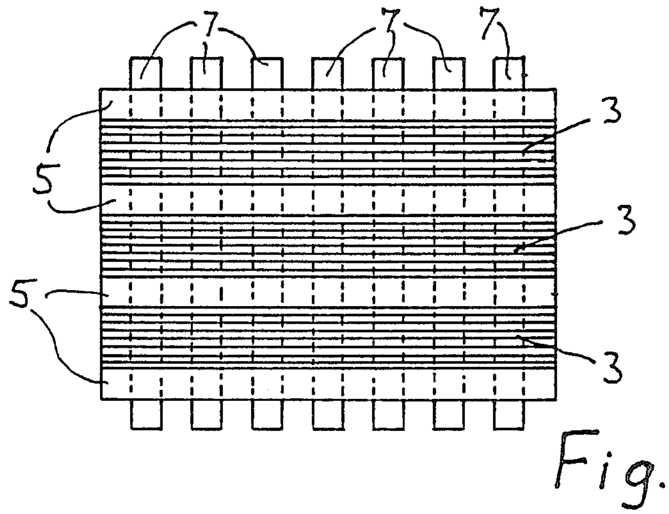
FIG. 3 is a plan view of an ultrasonic test head according to the present invention including an oscillating crystal arrangement formed of piezo rods.

Damping bodies 2 with the basic design as disclosed above may be applied not only on one surface of a piezo plate 1 which serves an an individual oscillator, but may also be used with other oscillating crystal arrangements. FIG. 3 shows a schematic plan view of an embodiment of the invention from which it can be seen that piezo rods 7, instead of a piezo plate 1, are arranged below damping body 2 which is formed of several sound-conducting lamellae 3 and several sound-absorbing lamellae 5. Sound-conducting piezo rods 7 extend at right angles to the lamellae 3, 5. Specifically, the piezo rods 7 may be formed by retroactive processing of the piezo plate 1. FIG. 3 thus illustrates that the damping body 2 composed of lamellae 3, 5 may also be used in a linear group radiator.

Figure 5:
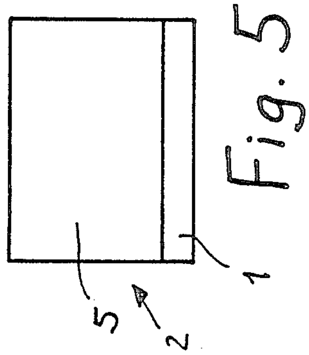
FIG. 5 is a side elevational view of the ultrasonic test head of FIG. 4.
Figure 6:
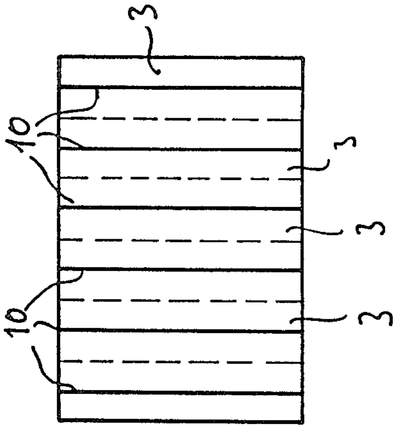
FIG. 6 is a plan view of the ultrasonic head of FIG. 4.

FIGS. 4, 5 and 6 also show, schematically, a damping body 2 designed in lamellae fashion. FIG. 4 shows sound-conducting lamellae 3 having a wedge-shaped cross section and which preferably are formed of lead. The sound-conducting lamellae 3 are soldered at their bases 8 to the piezo plate 1 or other piezo ceramic. While in the embodiments illustrated in FIGS. 1 through 3 the sound-conducting lamellae 3 are not in mutual contact, lamellae 3 are in mutual contact at their base 8 in the embodiment of FIG. 4.

Sound-absorbing wedge-shaped lamellae 5 of complementary shape are located between the wedge-shaped sound-conducting lamellae 3 and may be composed of the materials disclosed hereinabove. Specifically, the sound-absorbing lamellae 5 may be teflon wedges which are glued to the sound-conducting lamellae 3 and have a thickness, at their upper edges, of 1.5 mm, if the sound-conducting wedges formed by the sound-conducting lamellae 3 have a thickness of 1.5 mm at their bases.

FIG. 5 shows a side elevation of a damping body 2 and the piezo plate 1 to illustrate the geometric arrangement of damping body 2, the dimensions of which are disclosed hereinabove.

FIG. 6 shows a schematic plan view of the ultrasonic test head. From FIG. 6 it can be seen that the sound-conducting lamellae 3 extend into edges 10 so as to avoid reflections as much as possible.

Figure 9:
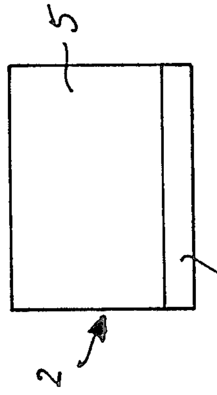
FIG. 9 is a side elevational view of the ultrasonic test head of FIG. 7.
Figure 8:
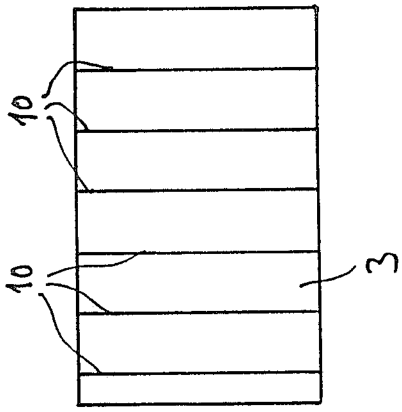
FIG. 8 is a plan view of the ultrasonic test head of FIG. 7.
Figure 10:
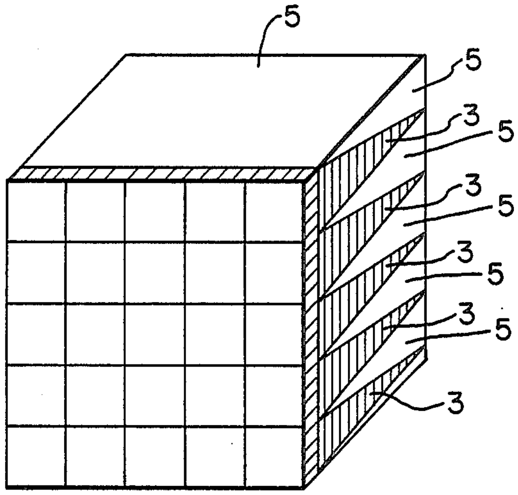
FIG. 10 is a perspective view of a mosaic array version of a test head.

Presented schematically in FIGS. 7, 8 and 9 is another embodiment of an ultrasonic test head which includes a damping body 2 with yet another lamellae arrangement. In FIGS. 7–9, corresponding components are referenced similarly as in the embodiments discussed hereinabove. The embodiment presented in FIGS. 7–9 uses sawtooth-shaped sound-conducting lamellae 3 and corresponding sawtooth-shaped sound-absorbing lamellae 5. The lamellae 3, 5, while being sawtooth shaped in cross section, have a rectangular configuration, as shown in the side elevational view of FIG. 9. FIG. 8 illustrates the position of the edges 10 between which the sound-conducting upwardly extending lamellae 3.

The damping body 2, of course, may be designed for any conceivable geometry of the oscillating crystal arrangement of the piezo ceramic. A damping body 2 of lamellae type design according to the invention is also especially well suited for array ultrasonic test heads designed in mosaic fashion.

Tests conducted on a steel block of 100 mm thickness, with an ultrasonic test head having an active surface of 30 mm by 40 mm, showed that at a mean frequency of about 1 MHz, with the aid of a back wall echo sequence, an amplification reserve of more that 60 dB can be achieved. The invention thus allows the realization of very wideband ultrasonic test heads with a damping body whose specific acoustic impedance can be designed to be within wide limits and which, in addition to high acoustic absorption, is also characterized by high mechanical integrity and an extremely simple, and thus low-cost, structure.

While this invention has been described as having a preferred design, it will be understood that it is capable of further modification. This application is therefore intended to cover any variations, uses, or adaptations of the invention following the general principles thereof and including such departures from the present disclosure as come within known or customary practice in the art to which this invention pertains and falls within the limits of the appended claims.

What is claimed is:

1. An ultrasonic test head comprising:
an oscillating crystal (1);
a damping body (2) disposed on a surface of said oscillating crystal on the side opposite to the sonic beam direction, said damping body (2) including first and second pluralities respectively of sound-conducting and sound-absorbing lamellae (3, 5) which lamellae are all of substantially equal length and are stacked alternatively on one another, said lamellae each having one side (4, 8) coupled to the oscillating crystal (1), each said sound absorbing lamella (5) being completely separated from all other said sound absorbing lamellae (5) by said sound conducting lamellae (3), whereby each lamella (3, 5) of both said first and second pluralities is completely separated from the other identical lamellae, the shapes of said sound absorbing and sound conducting lamellae being complementary.

2. The ultrasonic test head according to claim 1, characterized in that the sound-conducting lamellae (3) are composed of metal.

3. The ultrasonic test head according to claim 2, characterized in that the metallic lamellae (3) are wedge-shaped in cross section.

4. The ultrasonic test head according to claim 3, characterized in that said metallic wedge-shaped lamellae (3) are each connected on their base side (8) with the oscillating crystal (1).

5. The ultrasonic test head according to claim 2, characterized in that the metallic lamellae (3) are sawtooth-shaped in cross section.

6. The ultrasonic test head according to claim 5, characterized in that the metallic sawtooth-shaped lamellae (3) are each connected on their base sides (8) with the oscillating crystal.

7. The ultrasonic test head according to claim 1 characterized in that the lamellae (3) are soldered to the oscillating crystal (1).

8. The ultrasonic test head according to claim 1 characterized in that the lamellae (3) are secured to the oscillating crystal (1) with an adhesive.

9. The ultrasonic test head according to claim 1, characterized in that the lamellae (3) are cemented to the oscillating crystal (1).

10. The ultrasonic test head according to claim 1, characterized in that the sound-conducting lamellae (3) comprise lead platelets.

11. The ultrasonic test head according to claim 1, characterized in that the sound-absorbing lamellae (5) are composed of a material selected from the group consisting of teflon, rubber, silicone rubber, PVC, casting resin or a plastic adhesive.

12. The ultrasonic test head according to claim 10, characterized in that tungsten powder is embedded in the sound-absorbing lamellae (5).

13. The ultrasonic test head according to claim 1, characterized in that the oscillating crystal comprises a planar piezo plate (1).

14. The ultrasonic test head according to claim 1, characterized in that the oscillating crystal comprises a plurality of rod-shaped oscillators (7) whose longitudinal axes extend traversely to the planes of the lamellae (3,5)

15. The ultrasonic test head according to claim 1, characterized in that the oscillating crystal is a test head array designed in mosaic fashion.

16. The ultrasonic test head according to claim 1, characterized in that the lamellae are clamped together by a clamping device.

17. The ultrasonic test head according to claim 1, characterized in that the oscillating crystal and the damping body (2) are cast in a metal housing which is provided on its sound-emitting side with a protective layer for the oscillating crystal.

18. An ultrasonic test head comprising a generally planar oscillating crystal (1);
a damping body (2) disposed on a surface of said crystal, said damping body (2) including a first plurality of metallic sound-conducting lamellae (3), said lamellae (3) being tapered in cross section, and a second plurality of complementary shaped sound-absorbing lamellae (5) alternatingly disposed between said first plurality of lamellae (3) and completely separating each lamella (3, 5) of said first plurality and forming a stack of lamella therewith, each of said lamellae secured to and in direct contact with said surface of said crystal, all said lamellae of both said first and second pluralities being of substantially equal lengths.

* * * * *

UNITED STATES PATENT AND TRADEMARK OFFICE
CERTIFICATE OF CORRECTION

PATENT NO. : 4,751,420

DATED : June 14, 1988

INVENTOR(S) : Wolfgang Gebhardt et al

It is certified that error appears in the above-identified patent and that said Letters Patent is hereby corrected as shown below:

Col. 4, line 53, change "of" first occurrence to --or--;

Signed and Sealed this

Twenty-seventh Day of December, 1988

*Attest:*

DONALD J. QUIGG

*Attesting Officer*

*Commissioner of Patents and Trademarks*